United States Patent [19]

Nakae et al.

[11] Patent Number: 4,565,747

[45] Date of Patent: Jan. 21, 1986

[54] BORON NITRIDE CONTAINING TITANIUM NITRIDE, METHOD OF PRODUCING THE SAME AND COMPOSITE CERAMICS PRODUCED THEREFROM

[75] Inventors: Hiroyuki Nakae, 14-7, Kamiasao 1 chome, Asao-ku, Kawasaki-shi, Kanagawa; Toshitsugu Matsuda, 67-4, Futamatagawa 1 chome, Asahi-ku, Yokohama-shi, Kanagawa; Naoki Uno, Furukawa Denko Kibogaoka Shataku, 11-3, Nakakibogaoka, Asahi-ku, Yokohama-shi, Kanagawa; Yukio Matsunami, Nihon Jukagaku Kogyo Daini Mitakaryo, 8-7-6, Kamirenjaku, Mitaka-shi, Tokyo; Toshio Hirai, 4-91, Takamori 3-chome, Izumi-shi, Miyagi; Tsuyoshi Masumoto, 8-22, Kamisugi 3-chome, Sendai-shi, Miyagi, all of Japan

[73] Assignees: Research Development Corporation, Tokyo; Hiroyuki Nakae, Kawasaki; Toshitsugu Matsuda; Naoki Uno, both of Yokohama; Yukio Matsunami, Tokyo; Toshio Hirai, Izumi; Tsuyoshi Masumoto, Sendai, all of Japan

[21] Appl. No.: 670,154

[22] Filed: Nov. 9, 1984

[30] Foreign Application Priority Data

Nov. 11, 1983 [JP] Japan .............................. 58-211035
Nov. 11, 1983 [JP] Japan .............................. 58-211036

[51] Int. Cl.⁴ .................... B32B 18/00; C04B 35/58
[52] U.S. Cl. ................................... 428/698; 264/81; 423/275; 423/290; 423/297; 427/248.1; 427/255.2; 501/92; 501/96

[58] Field of Search .............. 427/248.1, 255.2; 428/698; 501/96; 423/290, 297, 276, 411, 266, 275; 264/81

[56] References Cited

U.S. PATENT DOCUMENTS 3,152,006 10/1964 Basche ............................... 428/688
3,352,637 11/1967 Heymer et al. .................... 423/290
3,451,772 6/1969 McCabe et al. .................. 264/81 X

FOREIGN PATENT DOCUMENTS 43-15078 1/1968 Japan .
1199811 7/1970 United Kingdom ................ 423/411

OTHER PUBLICATIONS

Campbell, I. E. et al., "The Vapor-Phase Deposition of Refractory Materials"-Trans. Electrochem. Soc., 96 (5), 1949, pp. 318-333.

Primary Examiner—Helen M. McCarthy
Attorney, Agent, or Firm—Flynn, Thiel, Boutell & Tanis

[57] ABSTRACT

Boron nitride containing titanium nitride in an amount of 0.05 to 10 wt. % which is produced at a relatively low temperature, utilizing a chemical vapor deposition technique. In the deposition process, boron, titanium and nitrogen source gases are introduced into an evacuated reactor together with a carrier and/or diluent gas and contacted with a heated substrate previously mounted in the reactor, whereby boron nitride with titanium nitride is deposited onto the substrate. The deposit thus obtained has a high density, a significantly improved heat-shielding ability, a high degree of anisotropy with respect to thermal diffusivity and a high chemical stability. By using such anisotropic boron nitride with BN ceramics, very useful BN type composite ceramics can be produced.

22 Claims, 8 Drawing Figures

BORON NITRIDE CONTAINING TITANIUM NITRIDE, METHOD OF PRODUCING THE SAME AND COMPOSITE CERAMICS PRODUCED THEREFROM

BACKGROUND OF THE INVENTION

The present invention relates to boron nitride containing titanium nitride which are produced by a vapor deposition technique and a method of producing them.

The present invention is further directed to BN type composite ceramics produced from the boron nitride.

Boron nitride (BN) is superior in high temperature stability, chemical stability and electric insulating property. Particulary hexagonal type BN has a useful anisotropy in thermal conductivity in addition to the foregoing superiority and thus the anisotropic boron nitride has been extensively used as useful materials for various kinds of crucibles, heat insulators and wave guide for microwave, etc.

Particulaly, boron nitride (BN) produced by means of chemical vapor deposition is evaluated as a high quality BN because it is highly pure and free from contamination and great developments in its use are taking place. On the other hand, massive body of boron nitride has been produced by adding boric acid or silica glass as sintering assistant agent to powdered boron nitride and then sintering under atmospheric pressure or hot press sintering. The sintered body thus produced is quite different from boron nitride produced by chemical vapor deposition technique in purity and microstructure.

The production of boron nitride by means of chemical vapor deposition is known to be carried out in the following manner. Boron-containing gas, for example, $BCl_3$, $BF_3$, or $B_2H_6$, and nitrogen-containing gas, for example, $NH_3$ or $N_2$, are employed as source gases for depositing boron and nitrogen and these two kinds of the gases are allowed to react at a high temperature to form boron nitride. In this production process, if a solid substrate, such as graphite plate or metal rod, is present, boron nitride is deposited in a layered form onto the surface of the solid, thereby a thin film or massive deposit of boron nitride can be obtained. Since the boron nitride thus obtained by the chemical vapor deposition has a C-planes of crystallites of boron nitride orienting in parallel with the substrate, the properties are different between its depositing direction and the direction perpendicular to the depositing direction. Since the boron nitride by the chemical vapor deposition has the foregoing anisotropy in addition to the advantages, such as a high purity, a high corrosion resistance at an elevated temperature and superior electrical insulating property, it has become increasingly important as a unique material.

However, in the conventional vapor deposition method, for example, as disclosed in U.S. Pat. No. 3,152,006, a high density boron nitride can be deposited only at a high temperature of 1850° to 2200° C. For example, in the method of the aforesaid U.S. patent a boron nitride with a high density of 1.99 to 2.20 g/cm³ is not produced until the depositing temperature is elevated to 1850° C. Thus, such a high temperature is indispensable for the deposition of boron nitride in the prior art and this fact is not only unfavolable from the standpoint of energy efficiency but also presents serious difficulties in enlargement of the production facilities and improvement of productivity. Under such circumstances, it is highly desirable to develop a new production method which makes possible the deposition of a high density boron nitride at lower temperatures.

Further, with respect to a massive body of boron nitride containing titanium, Japanese Patent publication No. 43-15078 discloses composite sintered bodies composed of titanium diboride and boron nitride. But boron nitride containing titanium nitride which is produced utilizing vapor deposition technique is not known up to date.

SUMMARY OF THE INVENTION

It is therefore an object of the present invention to provide boron nitride containing titanium nitride by chemical vapor deposition, the method of producing the same and composite shaped articles prepared therefrom.

The present invention has the three aspects set forth below and, according to the first aspect, there is provided boron nitride produced by vapor deposition, the boron nitride containing titanium nitride in an amount of 0.05 to 10 wt. % and more preferably 0.05 to 2.0 wt. %. It is preferred that titanium nitride incorporated into the deposited boron nitride is a crystal or single crystal particle form with a diameter of not greater than 100 Å.

Further, the second aspect is directed to a method of producing a high density boron nitride containing titanium nitride set forth above. In the technique for depositing boron nitride from the gas phase reaction between a boron depositing source gas and a nitrogen depositing source gas, a titanium depositing source gas is additionally mixed to the boron source gas. More specifically, the method of the present invention comprises the steps of:

(a) mounting a substrate shaped into a desired form in a ractor;

(b) evacuating said reactor and heating the substrate to the temperature range of 500° to 2000° C.;

(c) introducing a boron depositing source gas, a nitrogen depositing source gas, a titanium depositing source gas and carrier and/or diluent gas into said evacuated reactor, and then contacting the source gases with the said substrate within the substrate temperature ranging from 500° to 2000° C. and at the total internal pressure of the said reactor ranging from 0.1 to 770 torr, whereby depositing said boron nitride containing titanium nitride, the ratio of the titanium depositing source gas to the boron depositing source gas being controlled to give a Ti/B atomic ratio of 0.005 to 0.45, (d) continuing to feed the source gases and the carrier and/or diluent gas while degassing to maintain the total internal pressure of said reactor within the pressure range of 0.1 to 770 torr until the desired amount of the boron nitride is deposited onto the substrate;

(e) cooling and taking out the substrate; and (f) removing said deposited boron nitride from the substrate.

Still further, the third feature is to provide boron nitride type composite ceramics shaped into a desired form which are produced by forming a boron nitride ceramic layer containing titanium nitride as a base layer on the surface of a substrate and, subsequently, a BN ceramic layer as a surface layer on the base layer. In the third feature, multi-layer composite ceramics can be also prepared by repeatedly forming the surface layer and the base layer.

The boron nitride of the present invention contains titanium component in the form of titanium nitride and its matrix is composed of boron nitride formed by vapor deposition. Such boron nitride of the present invention has a very useful anisotropy in thermal conductivity in addition to the superiority in heat resistance, chemical stability, electrical insulating property, etc. Thus, the boron nitride can be widely employed as very useful materials in various applications. Such materials are quite novel and superior over the prior art.

DETAILED DESCRIPTION OF THE PREFERRED EMBODIMENTS

As described above, one aspect of the present invention resides in a novel boron nitride containing titanium nitride which is produced by chemical vapor deposition process. The boron nitride produced by the chemical vapor deposition of the present invention is made up of a matrix of polycrystalline boron nitride, in which the C-plane of crysytallite of boron nitride is oriented in the direction parallel to the substrate surface (hereinafter, referred to as "deposition surface") to be coated, and fine titanium nitride particle with a diameter of not greater than 100 Å uniformly dispersed throughout boron nitride matrix. Titanium nitride contained in the boron nitride is preferably in a crystal particle state and more preferably in a single crystal particle state. The boron nitride crystal of the present invention forming the matrix normally has a turbostratic structure which is composed of hexagonal network layers lying incompletely one over another at a somewhat long interlayer spacing of 3.35 to 3.45 Å. The turbostratic structure is different from the structure of hexagonal type boron nitride crystal which is composed of hexagonal network layers entirely lying one over another in a three-dimensional arrangement. However, the present invention can also develope the hexagonal type crystalline boron nitride and further amorphous boron nitride by appropriately controlling the production conditions.

Titanium is contained in the form of titanium nitride and its content is in the range of 0.05 to 10 wt. %, and preferably 0.05 to 2.0 wt. %, as titanium nitride. The titanium nitride content can be controlled by the production conditions. When the titanium nitride content is less than 0.05 wt. %, the effect of titanium nitride can not be achieved. On the other hand, a content of titanium nitride more than 10 wt. % will result in an uneven composition.

Although the boron nitride of the present invention containing titanium nitride exhibits different density depending on production conditions, the density falls within the range of 1.4 to 2.3 gr/cm$^3$. Particularly, boron nitride with a density of 2.0 to 2.2 gr/cm$^3$ produced by the chemical vapor deposition is more preferable as materials.

Boron nitride containing titanium nitride produced by the chemical vapor deposition of the present invention exhibits an extremely small thermal diffusivity in the direction perpendicular to the deposition surface and thus a wide application as heat-insulating materials will be expected. The boron nitride by the conventional chemical vapor deposition has, as set forth above as to the present invention, a structure in which the C-plane of crystallite of the boron nitride is oriented parallel to the deposition surface and, due to the structure, shows a remarkable anisotropic property in its thermal diffusivity which is not detected in ordinary sintered bodies. More specifically, the thermal diffusivity of boron nitride is from $10^{-2}$ to $12 \times 10^{-3}$ cm$^2$/sec. in the vertical direction and $5 \times 10^{-1}$ cm$^2$/sec. in the parallel direction with respect to the deposition surface, respectively. This thermal anisotropic property makes boron nitride useful as heat-shield materials in the vertical direction of the deposition surface and conductor materials in the direction parallel to the deposition surface.

The boron nitride containing titanium nitride which is produced by the chemical vapor deposition of the present invention has a further decreased thermal diffusivity of about ½ to 1/5 of that of the aforesaid boron nitride produced by the convnetional vapor deposition.

Figure 1:
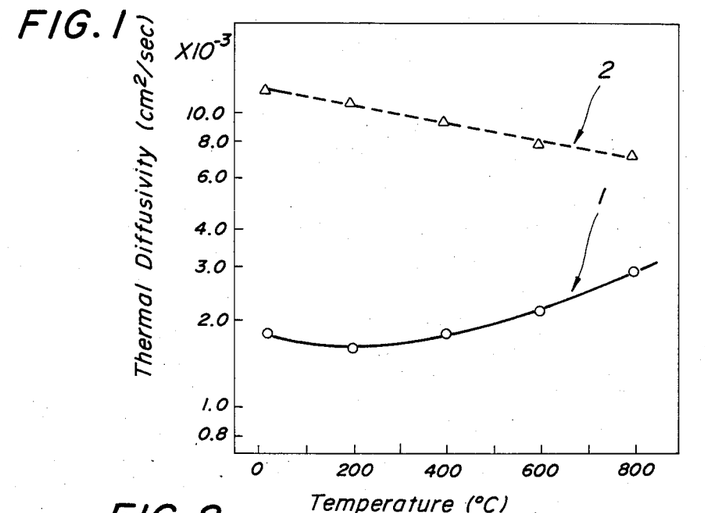
FIG. 1 is a graph showing the thermal diffusivity in the deposition direction versus temperature for one example of boron nitride containing titanium nitride produced by the chemical vapor deposition of this invention and for the boron nitride by the conventional chemical vapor deposition.

FIG. 1 is a graph plotting the thermal diffusivity (1) of the invention boron nitride in the direction perpendicular to the deposition surface versus temperature change, in comparison with the thermal diffusivity (2) of boron nitride by the conventional chemical vapor deposition.

The relationship between thermal diffusivity and thermal conductivity is indicated as follows.

$$\text{Thermal Conductivity} = \text{Density} \times \text{Specific Heat} \times \text{Thermal Diffusivity} \qquad (1)$$

The titanium nitride-containing boron nitride produced by the chemical vapor deposition in accordance to the present invention has a density of 1.4 to 2.3 g/cm$^3$, and it is understood that the density of the above equation (1) is almost the same between the invention boron nitride and the conventional boron nitride, considering that the density of the conventional boron nitride is from 2.0 to 2.2 gr/cm$^3$. Specific heat is determined by the constituent components. The boron nitride of the present invention forming a matrix and the conventional boron nitride have the same specific heat, and more specifically the specific heat is about 0.2 cal/gr °C. at room temperature. On the other hand, the specific heat of titanium nitride is about 0.15 cal/gr °C. at room temperature. Thus, since the term of the specific heat of the equation (1) is also almost the same between the present invention and the prior art, it may be concluded that the difference in thermal diffusivity between both boron nitride shown in FIG. 1 reveals the difference of the thermal conductivities between them.

Figure 2:
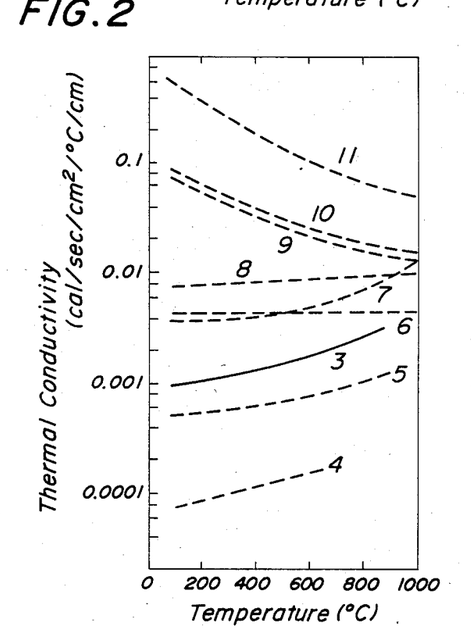
FIG. 2 is a graph showing thermal conductivities in the deposition direction for the boron nitride containing titanium nitride produced by the chemical vapor deposition of the present invention and for other conventional ceramic materials.

FIG. 2 shows the thermal conductivity of boron nitride of the present invention (3) in comparison with the conductivities of the various conventional materials.

The thermal conductivities plotted in the figure were all calculated from the equation (1) using thermal diffusivities. The lines in FIG. 2 show the respective thermal conductivities of powdered magnesia 4, insulating fire brick 5, stabilized zirconia 6, transparent quartz glass 7, fireclay refractory 8, alumina sintered body 9, magnesia sintered body 10 and beryllia 11. Since boron nitride of the present invention containing titanium nitride exhibits a lower thermal conductivity and are further, as in the boron nitride produced by the conventional chemical vapor deposition, gas-tight (dense and non-porous) and highly resistant against thermal shock and corrosion at high temperature services, they are very useful as heat insulating materials.

Now, the method of producing boron nitride containing titanium nitride by the chemical vapor deposition according to the present invention will be described hereinafter.

In a method for producing boron nitride from boron depositing source gas and a nitrogen depositing source gas by utilizing a chemical vapor deposition technique, the invention boron nitride containing titanium nitride is produced by adding a titanium depositing source gas to the boron depositing gas.

As the boron depositing source gas, halides, such as $BCl_3$ and $BF_3$; hydrides for example, $B_2H_6$, $B_{10}H_{14}$; nitrogen-containing boron compounds, such as $B_3N_3H_6$ (borazine) and $B_3N_3H_3Cl_3$ (borazole trichloride); and alkyl boron compounds, such as $B(C_2H_5)_3$ or $B(CH_3)_3$ can be employed either singly or in combination of two or more thereof. Preferably, $BCl_3$, which is gaseous at room temperature, is employed.

As the nitorogen depositing source gas, the hydrides, for example, $HN_3$, $NH_3$ and $N_2H_4$; ammonium chlorides, for example, $NH_4Cl$, $NH_4Br$, $NH_4F$, $NH_4HF_2$, and $NH_4I$; and $N_2$ can be used solely or in combination thereof and preferably $NH_3$ is employed because it is inexensive.

Further, as the titanium depositing source gas, the titanium hydrides, such as $TiCl_4$, $TiBr_4$, $TiF_4$ and $TiI_4$ can be used singly or in combination thereof. Particularly, $TiCl_4$ is advantageously used because of its relatively cheap cost and high vapor pressure.

In addition to the aforesaid source gases, one or more gases of nitrogen($N_2$), argon(Ar), helium(He) and hydrogen($H_2$) are employed as carriers and/or diluents for the source gases and, particularly, hydrogen gas is preferable.

In the deposition process, firstly a substrate shaped into a desired form is mounted in a reactor and then the reactor is evacuated. Thereafter, the substrate is heated to 500° to 2,000° C. and the source gases for depositing boron, titanium and nitrogen, and carrier gas and/or diluent gas are introduced into a reactor containing the heated substrate therein and fed until the desired thickness of deposit is obtained. In this stage, it is advantageous to introduce separately the gases into the reactor through two or more inlet passages, using appropriate combined tubes, such as a double or triple tube or the like, and then mix them near the surface of a substrate from the viewpoints of the greater reaction efficiency and the increased deposition rate. However, after mixing all of the source gases, the resulting mixed gases may be introduced into the reactor.

During the vapor deposition, the temperature of the substrate is maintained at temperatures of 500° to 2000° C., preferably from 1000° to 1500° C. and most preferably 1200° to 1400° C. and the total internal pressure of the reactor is adjusted in the range of 0.1 to 770 torr., preferably from 0.5 to 50 torr and most preferably from 1 to 15 torr, by appropriately degassing.

Further, the relation between the production conditions of the method according to the present invention and the properties of boron nitride containing titanium nitride which was produced by the method are described.

Figure 3:
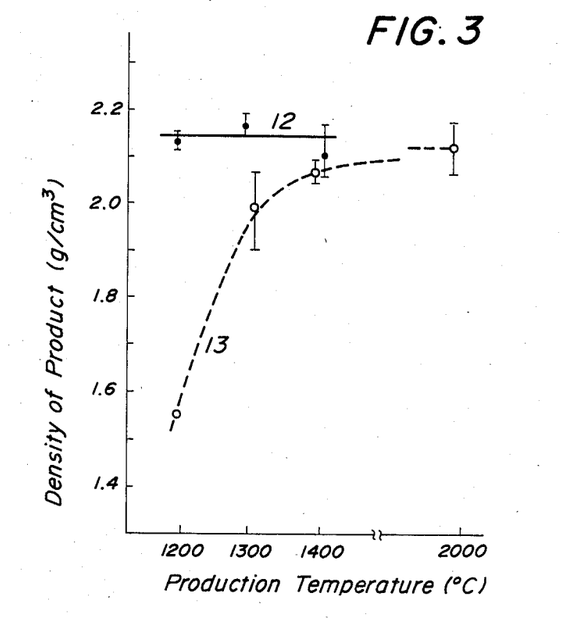
FIG. 3 is a graph showing the relation between the production temperatures and densities for one example of the invention boron nitride with titanium nitride and for the conventinal boron nitride without titanium nitride.

FIG. 3 is graph showing, as an example, the effect of the production temperatures on densities of deposited products, in which line 12 is for the boron nitride containing titanium nitride by the chemical vapor deposition according to the present invention and line 13 is for the boron nitride not containing titanium nitride which was produced by the conventional chemical vapor deposition. With respect to the data shown in FIG. 3, other conditions than the production temperature were not changed in both cases of using titanium depositing source gas and no titanium depositing source gas.

As will be seen from FIG. 3, it has found that in the case of adding titanium, high density products can be obtained even at a lower temperature as compared with the case of using no titanium. Such a high density product can be achieved not only by the incorporation of titanium in the form of titanium nitride into the boron nitride matrix but also by a high degree of crystallization of boron nitride forming the matrix. In the case of boron nitride with titanium nitride shown in FIG. 3, titanium nitride content is approximately 0.5 wt. % and such a small content of titanium nitride makes only a very small contribution to the increase of density. Thus, the high density achieved in the present invention is substantially due to the high crystallinity. The crystallinity of boron nitride can be known by measuring the interlayer spacing of C-planes of boron nitride and the shorter the distance, the higher the crystallinity of boron nitride.

Figure 4:
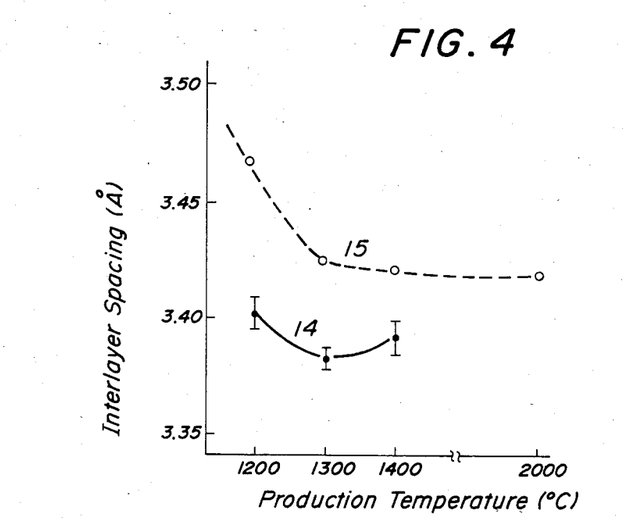
FIG. 4 is a graph showing the relation between the production temperatures and the interlayer spacings for the invention boron nitride with titanium nitride and for the prior art boron nitride.

FIG. 4 is a graph showing the effect of the produciton temperature on the interlayer spacing of boron nitride. In the figure, line 14 is for the boron nitride produced by chemical vapor deposition under addition of titanium source material and is compared with a reference boron nitride 15 deposited by chemical vapor deposition in the absence of gaseous titanium source material. The produciton conditions are the same as in FIG. 3.

As revealed in FIG. 4, the addition of titanium was found to deposit a highly crystallized boron nitride. Generally, boron nitride with a small crystallinity produced by chemical vapor deposition has a small density and is chemically unstable. Thus, in the conventional production, a higher temperature condition of 1850° C. or higher is essential in order to realize a highly crystallized stable deposit.

Contrary to the prior art, production method of the present invention, in which a titanium depositing source gas is added to a boron depositing source gas and mixed, can provide boron nitride containing titanium nitride at a lower temperature level, for example 1200° C., by the chemical vapor deposition and develop superior properties in the resulting boron nitride.

Further, in the production of a massive boron nitride by the chemical vapor deposition of the present invention, the depositon rate is an important factor and, the method of the present invention involving titanium addition makes possible a substantially increased depositon rate of one and a half times that of the method without the addition of titanium. For example, in the production of boron nitride containing titanium nitride by the chemical vapor deposition at 1400° C., the aimed deposition is produced at a depositon rate of not less than 0.2 mm/hr. and the increased deposition rate is particulary advantageous for producing massive product.

Although the content of the titanium nitride in boron nitride by the chemical vapor deposition in accordance with the present invention is controlled by the production temperature or the total internal pressure of a reactor, it is mainly controlled by the ratio between the flow rates of a boron source gas and a titanium source gas. For this reason, an addition amount of titanium source gas is required to be controlled in the appropriate range. In the present invention, the flow ratio of titanium depositing source gas to boron depositing source gas is regulated in such a manner that the Ti/B atomic ratio is in the range of 0.005 to 0.45. When the flow of titanium depositing source gas introduced into the reactor exceeds the upper limit, compounds such as TiN, $TiB_2$ are deposited in a layered form and an uneven dispersion of deposits will be resulted. Further, crystallization of boron nitride is detrimentally lowered. On the other hand, an insufficient addition less than the lower limit does not develop its effect in the produced deposits. A most preferable atomic ratio of Ti/B is in the range of 0.01 to 0.2.

Boron nitride containing titanium nitride which is produced by the chemical vapor deposition of the present invention can be shaped into various forms according to its application. More specifically, the boron nitride of the present invention can be produced into articles in various forms, such as thin film, plate, rod, pipe, crucible or the like.

The boron nitride containing titanium nitride of the present invention has a markedly increased heat-shielding property, in addition to superiorities in high heat temperature stability, chemical stability, lubricating property, workability, neutron absorbing ability and anisotropy, which are all heretofore known in boron nitride, and thus it can be extensively employed as high-temperature shielding material, heat shielding materials or jig used in furnaces for high temperature service, materials of crucibles used for growing a high purity metal or semiconductor crystal, electron beam hearth liner, electric materials, shielding material used in atomic reactors, etc.

The present invention further provide composite ceramics shaped in various forms which are composed of one or more boron nitride ceramic base layers containing titanium nitride in the amount specified previously and one or more BN ceramic surface layers and the feature of the present invention will be described in detail hereinater.

Figure 5A:
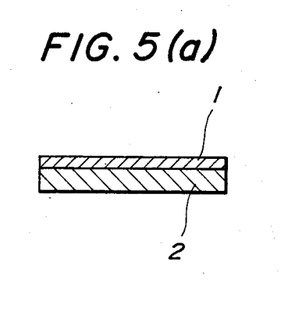
FIGS. 5(a) and 5(b) are sectional views of shaped composite ceramics with a double-layer structure.
Figure 5B:
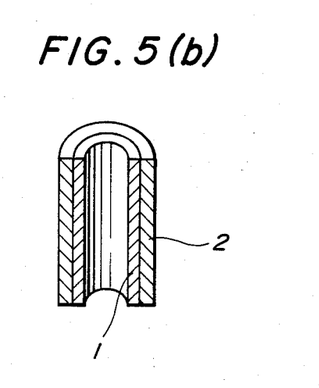

As one embodiment, shaped bodies comprising a boron nitride ceramic base-layer 2 containing titanium nitride and a BN ceramic surface layer 1 are shown in FIGS. 5(a) and 5(b), in which the surface layer 1 is formed on the one side of the base layer 2. In the production of the shaped bodies with a double layered structure, after forming the base layer 2, the surface layer 1 may be successively formed on the base layer 2, or, as an alternate method, the base layer 2 is firstly formed and after displaced in other apparatus, or other appropriate places, the surface layer 1 is formed on the base layer 2. Further, in both methods, the base layer 2 may be deposited after forming the surface layer 1.

Figure 6A:
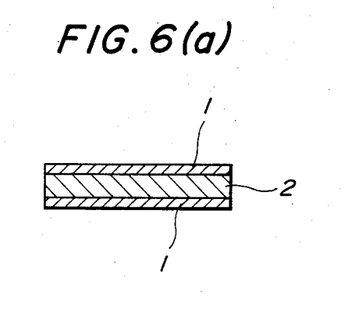
FIGS. 6(a) and 6(b) are sectional views of shaped composite ceramics with a triple-layer structure.
Figure 6B:
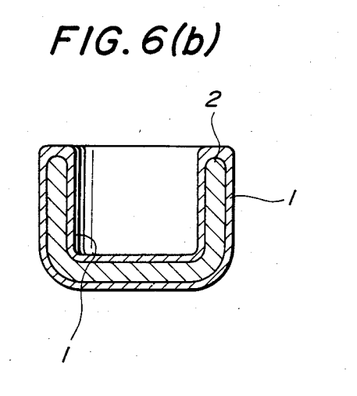

Further, as illustrated in FIGS. 6(a) and 6(b), the surface layer 1 may be formed on the both sides of the base layer 2 in order to prepare composite ceramics with a triple-layer structure. In this feature, firstly the one surface layer 1 is deposited, subsequently the base layer 2 is formed and then another surface layer 1 is deposited.

As a further embodiment, if neccessary, the surface layer and the base layer are may be repeatedly formed to produce multi-layer structures.

According to the present invention, boron nitride ceramics containing titanium nitride can be produced in the following procedures.

The production process of the boron nitride composite ceramic bodies is usually carried out by chemical vapor deposition. The boron nitride base layer is prepared similarly as described previously. In accordance to the method for producing boron nitride with titanium nitride, a substrate, made of graphite, BN, $TiB_2$, SiC, metallic molybdenum or quartz glass, in a desired form is mounted in an appropriate reactor, for example, in a vacuum heating furnace. After evacuating the reactor, the substrate is heated to a temperature of 500° to 2000° C., preferably 1000° to 1500° C. and most preferably from 1200° to 1400° C. and a boron source gas, a nitrogen source gas and a titanium source gas are directed onto the substrate under controlled conditions, whereby the aimed ceramic deposit is produced as a base layer.

Further, BN ceramic coating can be deposited onto the base ceramic layer in the same apparatus only by shutting out the Ti source gas. Alternatively, the BN ceramic coating can be deposited onto the base ceramic deposit, after taking out the substrate coated with the base ceramic deposit from the apparatus and then mounting it in a different apparatus. BN ceramics can be also deposited by physical vapor deposition technique, for example, evaporating, ion beam method and sputtering. Of course, the BN surface layer may be formed prior to the base layer and, further, both layers may be repeatedly formed.

In the composite ceramics thus produced, the difference between the boron nitride ceramic base layer with titanium nitride and the BN ceramic surface layer is whether a small amount of titanium compound is contained or not and both ceramics are almost the same substances. Thus, both layers are strongly bonded to each other and separation of the layers due to the difference in thermal expansion does not occur.

By virtue of the present invention, there are obtained products having the easiness of base layer formation in adition to advantageous properties of BN ceramic surface layer itself such as high chemical stability of the surface layer and non-reactivity against foreign substances.

The boundary between the BN ceramics and the boron nitride ceramics containing titanium nitride in accordance to the present invention is not always clear. Since the boron nitride ceramics containing titanium nitride are ordinarily black, while BN ceramics are white, they are distinguishable from one another. But, actually, the Ti concentration does not distinguishably change at the interface of the layers, but change gradually at a certain concentration gradient. Particularly, when the BN ceramic layer and the ceramic layer containing titanium nitride are continuously deposited, the Ti concentration tends to change in this manner.

The characteristic features of the shaped composite ceramics according to the present invention reside in that their mechanical strength is increased by boron nitride ceramics containg titanium nitride and functions required for their surface property are fulfilled by BN ceramics. Therefore, it is preferable to make thicker the ceramic layer containing titanium nitride and to make thinner the BN ceramic layer. More specifically, the thickness of the latter is from ½ to 1/10,000, and preferably 1/10 to 1/100, of that of the former. The thicker the composite ceramic product becomes, the less the ratio of the BN surface layer becomes.

According to the present invention, BN type ceramic articles can be obtained in various desired forms, e.g., sheet or plate, pipe, crucible, wafer, etc. and employed as a heat resistant materials at high temperature service, or as materials for the use in manufacturing metallic or semiconductor articles.

The present invention will now be described with reference to the detailed examples which follow.

EXAMPLE 1

$BCl_3$, $NH_3$ and $TiCl_4$ were used as source gases and $H_2$ gas is used as a carrier gas.

Flow rates of the respective gases were shown below and the Ti/B atomic ratio was 0.053.

| $BCl_3$ | 150 ml/min., | $NH_3$ | 90 ml/min., |
|---|---|---|---|
| $TiCl_4$ | 8 ml/min., | $H_2$ | 670 ml/min. |

A graphite substrate was mounted in a reactor and the reator was evacuated. After heating the substrate to 1400° C., the aforesaid gases were introduced and deposition was continued for 10 hours. During the deposition, the total internal pressure of the reactor was maintained 5 torr. After deposition of the desired amount, the gases were turned off and then the reactor was evacuated. The substrate having deposit thereon was cooled.

After cooling, the substrate was taken out of the reactor and the deposit was peeled off from the substrate. A blackish blue boron nitride containing titanium nitride was obtained as a specimen in a sheet form with a thickness of 1 mm and its properties were examined. The results were as follows.

TiN content—0.5 wt %
Density—2.16 gr/cm$^3$
Interlayer spacing of BN matrix—3.38 Å
Thermal diffusivity in the direction perpendicular to the deposition surface—$1.8 \times 10^{-3}$ cm$^2$/sec.

Further, it was found from the electron microscopic analysis of the specimen that titanium nitride particles with a diameter smaller than 100 Å were dispersed uniformly in BN matrix.

For comparison, a commercially available boron nitride produced by chemical vapor deposition was tested on the properties listed above and the results were as follows.

Density—2.14 gr/cm$^3$
Interlayer spacing of BN—3.42 Å
Thermal diffusivity in the direction perpendicular to the deposition surface—$7.8 \times 10^{-3}$ cm$^2$/sec.

It is found from the above test results that the boron nitride with titanium nitride by the chemical vapor deposition of the present invention has a small thermal diffusivity of about one-fourth that of boron nitride by the conventional chemical vapor deposition, in the direction perpendicular to the deposition surface and thus has a very high thermal shielding ability.

EXAMPLE 2

Boron nitride containing titanium nitride was produced under the same conditions as in Example 1 with respect to the flow rate of each gas, the deposition time and the internal pressure of the reactor except that the temperature of the substrate was heated to 1300° C.

After cooling, the substrate was taken out of the reactor and it was found that a 0.6 mm thick black layer of boron nitride containing titanium nitride was deposited on the surface of the substrate by the chemical vapor deposition.

On examination, the layer thus deposited was found to have the properties given below.

TiN content—0.9 wt. %
Density—2.19 gr/cm$^3$
Interlayer spacing of BN matrix—3.37 Å
Thermal diffusivity in the direction perpendicular to the deposition surface—$1.5 \times 10^{-3}$ cm$^2$/sec.

EXAMPLE 3

Further boron nitride containing titanium nitride was produced. In the production, the flow rate of each gas and the deposition time were as the same as in Example 1 and the internal pressure of the reactor and the temperature of the substrate were maintained to 10 torr and 1200° C.

After cooling, the substrate was taken out and there was obtained a 0.7 mm thick blackish-blue boron nitride layer containing titanium nitride on the substrate surface.

As a comparative Example, boron nitride was produced under the same condition as described in Example 3, but omitting $TiCl_4$ gas and a white boron nitride with a thickness of 0.5 mm was obtained on the substrate.

Measurements of density, elemental analysis and structural analysis were conducted on the respective specimens obtained in Example 3 and comparative Example and the results are listed in Table 1.

TABLE 1

| | Example 3 | Comparative Example |
|---|---|---|
| Density (gr/cm$^3$) | 2.03 | 1.53 |
| Composition: TiN Content (wt. %) | 1.7 | 0 |
| Interlayer spacing of BN (Å) | 3.40 | 3.61 |
| Deposition rate (mm/hr.) | 0.07 | 0.05 |
| Stability to humidity (weight increased by hydrolysis %) | not more than 0.05 | 3.2 |

In Table 1, stability to humidity was examined by measuring the increase in weight after leaving each specimen for one month in contact with air. The weight increase is due to the hydrolysis of boron nitride.

It is found from comparison in the above Table, in case the temperature of the substrate is relatively low, the comparative product has a small density and a low stability to humidity, whereas the product by the method of the present invention has a greater density and is stable to humidity.

EXAMPLE 4

Boron nitride deposits with various contents of titanium nitride were produced in which the spubstrate temperature and the total internal pressure of the reactor were adjusted to and maintained at 1400° C. and 5 torr, respectively, in the course of deposition process and the flow rate of each gas were varied as shown in Table 2 below. The properties of the respective deposits were examined for comparison. The production conditions and the properties are shown in Table 2 and Table 3, respectively.

TABLE 2

| | Temperature of Substrate (°C.) | Pressure (torr) | Flow Rate of Gas (ml/min.) | | | | Ti/B Atomic Ratio |
|---|---|---|---|---|---|---|---|
| | | | $H_2$ | $NH_3$ | $BCl_3$ | $TiCl_4$ | |
| Example | | | | | | | |
| 4-1 | 1400 | 5 | 800 | 90 | 150 | 2 | 0.013 |
| 4-2 | 1400 | 5 | 800 | 90 | 150 | 8 | 0.053 |
| 4-3 | 1400 | 5 | 800 | 90 | 150 | 15 | 0.1 |
| 4-4 | 1400 | 5 | 800 | 90 | 150 | 30 | 0.2 |
| 4-5 | 1400 | 5 | 800 | 90 | 90 | 35 | 0.39 |
| Comparative Example | | | | | | | |
| 4-1 | 1400 | 5 | 800 | 90 | 150 | 0 | 0 |
| 4-2 | 1400 | 5 | 800 | 90 | 70 | 35 | 0.5 |
| 4-3 | 1400 | 5 | 800 | 90 | 35 | 35 | 1.0 |

TABLE 3

| | Density (g/cm$^3$) | TiN Content (wt. %) | State of TiN | Interlayer Spacing of BN (Å) |
|---|---|---|---|---|
| Example | | | | |
| 4-1 | 2.10 | 0.13 | uniform dispersion of TiN particles | 3.41 |
| 4-2 | 2.16 | 0.65 | uniform dispersion of TiN particles | 3.38 |
| 4-3 | 2.17 | 1.29 | uniform dispersion of TiN particles | 3.40 |
| 4-4 | 2.18 | 2.58 | uniform dispersion of TiN particles | 3.42 |
| 4-5 | 2.20 | 9.05 | uniform dispersion of TiN particles | 3.42 |
| Comparative Example | | | | |
| 4-1 | 2.05 | 0 | — | 3.43 |
| 4-2 | 2.30 | 15.5 | uneven dispersion of TiN and TiB$_2$ | 3.44 |
| 4-3 | 2.80 | 58.2 | layered dispersion of TiN and TiB$_2$ | 3.45 |

As shown in Table 3, when a titanium nitride content exceeds 10 wt. %, an uneven dispersion of TiN and TiB$_2$ deposits was resulted, the effect of improving crystallization of BN diminishes and, further, the properties of TiN and TiB$_2$ deposited in a layered state more strongly appears with increase in the titanium content, whereby a useful anisotropy inherent in BN is seriousloy impaired. Further referring to Table 2, it become apparent that when the ratio of flow rate of the titanium depositing source gas to the boron depositing source gas is controlled so as to provide a Ti/B atomic ratio ranging from 0.005 to 0.45, superior deposits are produced.

EXAMPLE 5

(Production of a Double-Layer Composite Ceramic Body)

In the first deposition step, boron nitride including titanium nitride was produced onto a graphite substrate by chemical vapor deposition, using $BCl_3$, $TiCl_4$ and $NH_3$ as source gases and $H_2$ as a carrier gas. The flow rate of each gas was as follows:

| $BCl_3$ | 1 liter/min., | $TiCl_4$ | 0.1 liter/min. |
|---|---|---|---|
| $NH_3$ | 1 liter/min, | $H_2$ | 7 liter/min |

In this production, a substrate was amounted in a reactor and then the reactor was evacuated. After heating the substrate to 1300° C., the foregoing gases were introduced into the reactor to deposit the boron nitride containing titanium nitride onto the substrate. Deposition time was 10 hours and the total gas pressure inside the reactor was maintained at 5 torr in the course of the deposition by controlling appropriately evacuation. After the production was finished, the gases introduced into the reactor were shut off and the reactor was evacuated to vacuum state. Following the first step, the second deposition step was carried out to produce a BN ceramic coating.

In the second deposition step, the substrate, on which boron nitride containing titanium nitride was deposited in the first step, is heated from 1300° to 2000° C. and $BCl_3$ gas, $NH_3$ gas and $H_2$ gas were introduced into the evacuated reactor to produce BN ceramics.

The flow rates of the respective gases were the same as in the first stage described above and only $TiCl_4$ was omitted. During the second deposition, the internal pressure was maintained at 5 torr and the deposition time was 30 minutes.

After finishing the production of BN, the gases introduced were turned off and the reactor was evacuated. Thereafter, the substrate was allowed to cool near room temperature and taken out after leaking air into the reactor.

On examination, a 1 mm thick boron nitride layer containing titanium nitride which was produced in the first deposition step, was deposited as a base layer on the substrate and a 0.1 mm thick BN ceramic layer of the second deposition step was deposited as a surface layer on the base layer.

The adhesion at the boundary portion between boron nitride layer containing titanium nitride (base layer) and the BN ceramic layer (surface layer) was strong and an unfavorable delamination was not observed. Further, the surface layer and the base layer were separately removed from the substrate and their properties were tested. The test results were as follows:

Boron nitride containing titanium nitride (Base layer)
TiN content—1.9 wt. %
Density—2.20 g/cm$^3$
Interlayer spacing of BN matrix—3.37 Å
BN ceremics (surface layer)
Density—2.10 g/cm$^3$
Interlayer spacing of BN—3.39 Å

EXAMPLE 6

(Production of a Double-Layer Composite Ceramic Body)

In the first deposition stage, a boron nitride layer containing titanium nitride was deposited as a base layer onto the graphite substrate heated at 1300° C. under the same conditions described in Example 5.

After deposition was conducted for eight hours, the flow rate of $TiCl_4$ was reduced from 0.1 liter/min. to 0.01 liter/min over one hour at the substrate temperature of 1300° C. and at the internal gas pressure of the reactor of 5 torr, respectively. In this period, the flow rates of the respective gases of $BCl_3$ $NH_3$ and $H_2$ were 1 liter/min., 1 liter/min. and 7 liter/min., respectively and the same as those at the starting point.

Thereafter, the flow rate of $TiCl_4$ was gradually reduced from 0.01 liter/min. to 0 liter/min., over 30 minutes, and over this period the temperatur of the surface was continuously elevated from 1300° to 2000° C.

From this point, the second deposition step was started and BN ceramic surface layer were deposited for 30 minutes. During this period, the flow rates of $BCl_3$ gas, $NH_3$ gas and $H_2$ gas were kept at the above values and the gas pressure inside the reactor was also kept at 5 torr.

After the deposition of BN, all the gases were turned off and the reactor was evacuated to vacuum. Thereafter, the substrate was cooled near room temperature and, after leaking air into the reactor, it was taken out.

A deposit with a thickness of about 1 mm adhered to the substrate surface. In the resulting composite ceramic product, the concentration of Ti was continuously decreased toward the BN surface layer and thus, in comparison with Example 5, no clear boundary was observed and adhesion were very good.

EXAMPLE 7

(Preparation of a Triple-Layer Comosite Ceramic Body)

A rod-like graphite substrate with a diameter of 10 mm, one end of which was shaped into the hemisphere form, was disposed in a reactor. After the reactor was evacuated to vacuum, the substrate was heated to 1300° C. and $BCl_3$ gas, $NH_3$ gas and $H_2$ gas were introduced into the reactor at flow rates of 1 liter/min., 1 liter/min. and 7 liter/min., respectively, to produce BN ceramic deposit on the substrate.

Deposition time was one hour and the total pressure inside the reactor was maintained at 5 torr in the course of the production. Thereafter, feeding gases were discontinued and, after the reactor was evacuated to vacuum, the temperature of the substrate was lowered to 1200° C. Thereafter, the respective gases of $BCl_3$, $NH_3$, $TiCl_4$ and $H_2$ were introduced into the evacuated reactor at flow rates 1 liter/min., 1 liter/min., 0.3 liter/min. and 7 liter/min. and boron nitride containing titanium nitride (base layer) was deposited onto the foregoing BN ceramic layer.

The deposition time were 15 hours and the total gas pressure inside the reactor during this deposition process was maintained to 5 torr.

After producing the base layer, the gases introduced into the reactor were shut off, and the reactor was evacuated to vacuum. After heating the substrate to 1300° C., $BCl_3$ gas, $NH_3$ gas and $H_2$ gas were fed at flow rates of 1 liter/ min., 1 liter/min. and 7 liter/min., respectively, to deposit BN ceramic surface layer onto the aforementioned deposit (base layer). The deposition time is 1 hour and the total pressure inside the reactor was adjusted at 5 torr during this deposition process.

The substrate was taken out from the reactor in the same manner as in Examples 5 and 6 and the product deposited on the substrate was in a cylindrical vessel form having a hemisphere base and an inside diameter of 10 mm. The cross section in the direction of the thickness of the deposit was composed a triple layered structure and the BN layers (surface layer) on both sides of the base layer were about 0.1 mm in thickness and the base layer sandwiched between the BN layers was about 2 mm in thickness. Adhesion at boundaries were strong and no delamination was detected. After sampling base layer and the surface layer (inner surface of the cylindrical vessel) separately, their properties were tested and the following results were obtained.

BN ceramics (Inner surface of the cylindrial vessel)
Density—2.05 g/cm$^3$
Interlayer spacing of BN—3.42 Å
Boron nitride containing titanium nitride (Base layer)
TiN content—5.2 wt. %
Density—2.15 g/cm$^3$
Interlayer spacing of BN matrix—3.39 Å

As previously described in detail, the present invention provides a novel boron nitride containing titanium nitride which exhibits a very strong anisotropy with respect to the parallel and perpendicular directions to the deposition surface. Further, boron nitride having a high density and showing a much higher crystallinity can be obtained at a very low temperature by adding a small amount of a titanium containing compound under the production conditions set forth above. More specifically, high density BN type ceramics containing titanium nitride can be obtained at the lower temperatures of 500° to 2000 ° C.

In addition to the advantages, according to the present invention BN type composite ceramic products having the advantages and functions of BN ceramics can be produced in a high efficiency at low temperatures.

What is claimed is:

1. Boron nitride produced by chemical vapor deposition, said boron nitride containing titanium nitride in an amount of 0.05 to 10 wt. %.

2. Boron nitride as claimed in claim 1 in which said boron nitride contains titanium nitride in an amount of 0.05 to 2.0 wt. %.

3. Boron nitride as claimed in claim 1 in which said titanium nitride is contained in a fine particle form.

4. Boron nitride as claimed in claim 3 in which said titanium nitride is contained in the state of crystal.

5. Boron nitride as claimed in claim 4 in which said titanium nitride is contained in the state of crystal with a diameter of not greater than 100 Å.

6. Boron nitride as claimed in claim 5 in which titanium nitride is contained in a single crystal particle form.

7. Boron nitride as claimed in claim 1 in which said boron nitride is in a turbostratic structure.

8. Boron nitride as claimed in claim 7 in which the interlayer spacing of said turbostratic structure is in the range of 3.35 to 3.45 Å.

9. Boron nitride as claimed in claim 1 in which said boron nitride has a density of from 1.4 to 2.3 g/cm$^3$.

10. Boron nitride as claimed in claim 9 in which said boron nitride has a density of from 2.0 to 2.2 g/cm$^3$.

11. A method of producing boron nitride containing titanium nitride in an amount of 0.05 to 10 wt. % by a chemical vapor deposition, comprising the steps of:
   (a) mounting a substrate shaped into a desired form in a reactor;
   (b) evacuating said reactor and heating said substrate to the temperature range of 500° to 2000° C.;
   (c) introducing a boron depositing source gas, a nitrogen depositing source gas, a titanium depositing source gas and carrier and/or diluent gas into said evacuated reactor, and then contacting said source gases with said substrate within the substrate temperature ranging from 500° to 2000° C. and at the total internal pressure of said reactor ranging from 0.1 to 770 torr, thereby depositing said boron nitride containing titanium nitride, the ratio of said titanium depositing source gas to said boron depositing source gas being controlled to give a Ti/B atomic ratio of 0.005 to 0.45;
   (d) continuing to feed said source gases and said carrier and/or diluent gas while degassing to maintain said total internal pressure of said reactor within said pressure range until the desired amount of said boron nitride is deposited onto said substrate;
   (e) cooling and taking out said substrate; and
   (f) removing said deposited boron nitride from said substrate.

12. A method as claimed in claim 11 in which said temperature of said substrate is in the range of 1000° to 1500° C.

13. A method as claimed in claim 12 in which said temperature of said substrate is in the range of 1200° to 1400° C.

14. A method as claimed in claim 11 in which said total internal pressure of said reactor is maintained at 1 to 15 torr during the deposition process.

15. A method as claimed in claim 11 in which the ratio of said titanium depositing source gas to said boron depositing source gas is controlled to give a Ti/B atomic ratio ranging from 0.01 to 0.2.

16. A method as claimed in claim 11 in which said boron depositing source gas is one or more selected from the group consisting of $BCl_3$, $BF_3$, $B_2H_6$, $B_{10}H_{14}$, $B_3N_3H_6$ (borazine), $B_3N_3H_3Cl_3$ (borazol trichloride), $B(C_2H_5)_3$ and $B(CH_3)_3$.

17. A method as claimed in claim 11 in which said nitrogen depositing source gas is one or more selected from the group consisting of $HN_3$, $NH_3$, $N_2H_4$, $NH_4Cl$, $NH_4Br$, $NH_4F$, $NH_4HF_2$, $NH_4I$ and $N_2$.

18. A method as claimed in claim 11 in which said titanium depositing source gas is one or more selected from the group consisting of $TiCl_4$, $TiBr_4$, $TiF_4$ and $TiI_4$.

19. A method as claimed in claim 11 in which one or more gases of nitrogen($N_2$), argon(Ar), helium(He) and hydrogen($H_2$) are employed as carrier and/or diluent gas.

20. A method as claimed in claim 11 in which said substrate is made of graphite, SiC, BN, $TiB_2$, metallic molybdenum, or quartz glass.

21. A method as claimed in claim 11 in which said source gases are introduced separately through two or more inlet passages.

22. Boron nitride type composite ceramics composed of (1) one or more boron nitride ceramic base layers containing titanium nitride in an amount of 0.05 to 10 wt. % which is produced by chemical vapor deposition and (b) one or more BN ceramic surface layers.

* * * * *